(12) United States Patent
Park et al.

(10) Patent No.: US 11,005,053 B2
(45) Date of Patent: May 11, 2021

(54) ORGANIC LIGHT EMITTING DISPLAY APPARATUS COMPRISING A LIGHT CONVERSION FILM AND COMPOSITE FILM COMPRISING A LIGHT CONVERSION FILM

(71) Applicant: LG DISPLAY CO., LTD., Seoul (KR)

(72) Inventors: Seongwoo Park, Incheon (KR); Moonsun Lee, Seoul (KR); HaeYoon Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 36 days.

(21) Appl. No.: 16/115,086

(22) Filed: Aug. 28, 2018

(65) Prior Publication Data

US 2019/0067607 A1 Feb. 28, 2019

(30) Foreign Application Priority Data

Aug. 31, 2017 (KR) .......................... 10-2017-0111451

(51) Int. Cl.
| | |
|---|---|
| *H01L 29/08* | (2006.01) |
| *H01L 51/00* | (2006.01) |
| *H01L 51/52* | (2006.01) |
| *H01L 27/32* | (2006.01) |

(52) U.S. Cl.
CPC ........ *H01L 51/0097* (2013.01); *H01L 27/322* (2013.01); *H01L 27/3211* (2013.01); *H01L 51/5203* (2013.01); *H01L 51/5253* (2013.01); *H01L 51/5271* (2013.01); *H01L 2251/5338* (2013.01)

(58) Field of Classification Search
CPC ............. H01L 51/0097; H01L 51/5203; H01L 27/322; H01L 51/5271; H01L 51/5253; H01L 27/3211; H01L 2251/5338; H01L 27/3244; H01L 51/502; Y02E 10/549; G09F 9/301; G09F 9/33
USPC .......................................................... 257/40
See application file for complete search history.

(56) References Cited

U.S. PATENT DOCUMENTS

| | | | | |
|---|---|---|---|---|
| 6,603,243 B2 * | 8/2003 | Parkyn | ...................... | G09F 9/33 313/113 |
| 6,784,603 B2 * | 8/2004 | Pelka | ..................... | B82Y 10/00 313/110 |
| 7,456,914 B2 * | 11/2008 | Lee | ..................... | G02F 1/13452 349/150 |
| 7,629,330 B2 * | 12/2009 | Wang | ..................... | A61P 17/06 514/54 |
| 8,096,668 B2 * | 1/2012 | Abu-Ageel | ............ | G02B 5/045 362/84 |
| 9,252,373 B2 * | 2/2016 | Tischler | .............. | H01L 23/4985 |
| 9,351,392 B2 * | 5/2016 | Lee | ........................ | H05K 1/0209 |
| 9,769,919 B2 * | 9/2017 | Park | ..................... | G02F 1/1345 |

(Continued)

FOREIGN PATENT DOCUMENTS

KR 10-2014-0042274 A 4/2014

*Primary Examiner* — Caleb E Henry
(74) *Attorney, Agent, or Firm* — Birch, Stewart, Kolasch & Birch, LLP

(57) ABSTRACT

An organic light emitting display apparatus can include a substrate including an active area and a non-active area; a bending area in the active area of the substrate; a non-bending area in the active area of the substrate, the non-bending area being adjacent to the bending area; and a plurality of light conversion particles disposed in the active area of the substrate.

18 Claims, 5 Drawing Sheets

(56) References Cited

U.S. PATENT DOCUMENTS

| | | | | |
|---|---|---|---|---|
| 10,564,456 | B2* | 2/2020 | Son | G02F 1/133308 |
| 2011/0249424 | A1* | 10/2011 | Joo | H01L 33/50 |
| | | | | 362/97.1 |
| 2012/0126260 | A1* | 5/2012 | Hussell | F21V 3/00 |
| | | | | 257/88 |
| 2016/0132148 | A1* | 5/2016 | Han | G06F 3/044 |
| | | | | 345/174 |
| 2016/0275830 | A1* | 9/2016 | You | G06F 3/041 |
| 2017/0179423 | A1* | 6/2017 | Kwon | H01L 27/323 |
| 2017/0365814 | A1* | 12/2017 | Kim | H01L 51/5246 |
| 2018/0033843 | A1* | 2/2018 | Liu | G02F 1/133305 |
| 2019/0131351 | A1* | 5/2019 | Park | H01L 51/0097 |

* cited by examiner

ORGANIC LIGHT EMITTING DISPLAY APPARATUS COMPRISING A LIGHT CONVERSION FILM AND COMPOSITE FILM COMPRISING A LIGHT CONVERSION FILM

CROSS-REFERENCE TO RELATED APPLICATIONS

This application claims the benefit of the Korean Patent Application No. 10-2017-0111451 filed in the Republic of Korea on Aug. 31, 2017, which is hereby incorporated by reference as if fully set forth herein.

BACKGROUND

Field of the Invention

The present disclosure relates to an organic light emitting display apparatus.

Discussion of the Related Art

With the advancement of an information-oriented society, various requirements for display apparatuses for displaying an image are increasing. Organic light emitting display apparatuses, which are self-emitting display apparatuses, have a wide viewing angle, an excellent contrast, and a fast response time, and thus, are attracting much attention as next-generation display apparatuses. Recently, organic light emitting display apparatuses are being released that are even slimmer. Flexible organic light emitting display apparatuses are easy to carry and may be applied to various image display apparatuses. Flexible organic light emitting display apparatuses may include a bending area which enables a substrate to be folded. Also, the substrate may be folded by using the bending area, and thus, a bezel size is reduced, thereby implementing organic light emitting display apparatuses having a narrow bezel.

However, an optical film provided in the bending area is thick and vulnerable to a strain, and for this reason, as a degree of bending of organic light emitting display apparatuses increases, an outermost strain increases, and an internal strain of a panel is made even greater. For this reason, a light emitting device layer gets peeled off, and a thin film transistor is short-circuited. If the optical film provided in the bending area is removed for solving such problems, a color reproducibility of the bending area is reduced, and due to this, a sense of three dimensions and a sense of immersion are reduced.

SUMMARY

Accordingly, the present disclosure is directed to an organic light emitting display apparatus that substantially obviates one or more problems due to limitations and disadvantages of the related art.

An aspect of the present disclosure is directed to an organic light emitting display apparatus in which bending is easily performed, and color reproducibility of a bending area is enhanced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus including a substrate, including an active area divided into a bending area and a non-bending area and a non-active area surrounding the active area, and a plurality of light conversion particles provided in the bending area of the substrate.

Both the foregoing general description and the following detailed description of the present disclosure are explanatory and are intended to provide examples and further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Figure 1:
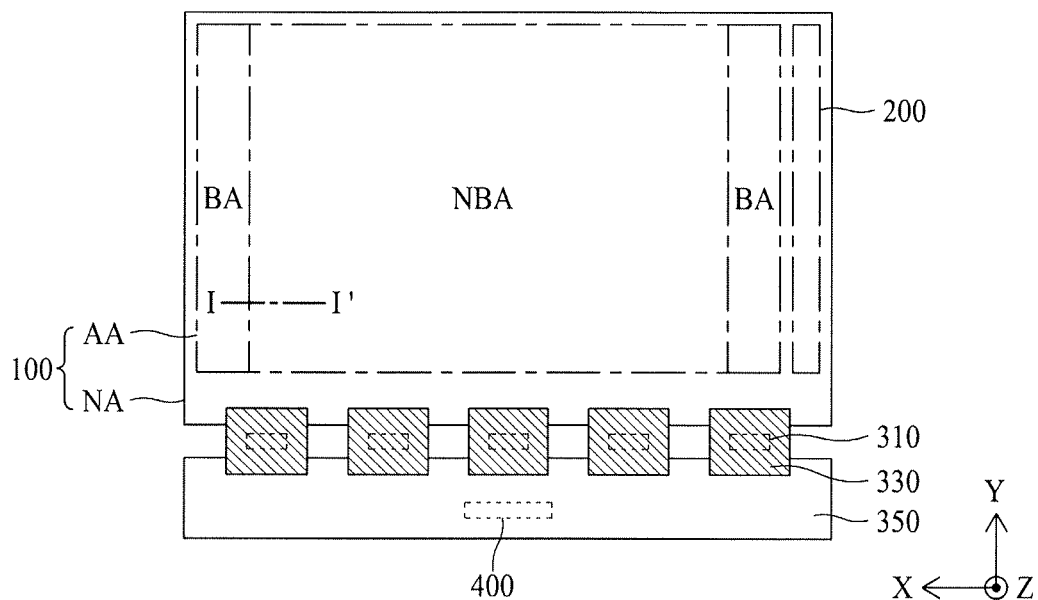
FIG. 1 is a plan view illustrating an organic light emitting display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of the claims.

A shape, a size, a ratio, an angle, and a number disclosed in the drawings for illustrating embodiments of the present disclosure are merely examples, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless 'just' or 'direct' is used.

In describing a time relationship, for example, when the temporal order is described as "after," "subsequent," "next," and "before," a situation which is not continuous may be included unless "just" or direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The phrase "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure may be performed independently from each other, or may be performed together in co-dependent relationship.

Hereinafter, example embodiments of an organic light emitting display apparatus according to the present disclosure will be described in detail with reference to the accompanying drawings. In the specification, in adding reference numerals for elements in each drawing, it should be noted that like reference numerals already used to denote like elements in other drawings are used for elements wherever possible.

FIG. 1 is a plan view illustrating an organic light emitting display apparatus according to an embodiment of the present disclosure.

Referring to FIG. 1, the organic light emitting display apparatus according to an embodiment of the present disclosure can include a substrate 100, a gate driver 200, a source drive integrated circuit (IC) 310, a flexible film 330, a circuit board 350, and a timing controller 400.

The substrate 100 can include an active area AA which displays an image and a non-active area NA which does not display an image. A plurality of gate lines, a plurality of data lines, and a plurality of pixels can be provided in the active area AA. The gate driver 200 and a plurality of pads can be provided in the non-active area NA.

The active area AA can be a display area which displays an image, and can be defined in a center portion of the first substrate 100. The active area AA according to an embodiment can be divided into a bending area BA provided in an edge thereof and a non-bending area NBA provided in a portion other than the bending area BA.

The bending area BA can be defined as an edge display area which displays an image on a side surface of the organic light emitting display apparatus. A width of the bending area BA according to an embodiment can be set based on a curvature radius when bending is performed.

The non-bending area NBA can be a front display area which displays an image on a front surface of the organic light emitting display apparatus.

The non-active area NA can be provided in a portion other than the active area AA provided on the substrate 100 and may be defined as an edge of the substrate 100 surrounding the active area AA. The non-active area NA can be a peripheral portion outside the active area AA and may not display an image unlike the active area AA.

The gate driver 200 can supply gate signals to the gate lines according to a gate control signal input from the timing controller 400. The gate driver 200 can be provided in the non-active area outside one side or both sides of the active area AA of the substrate 100 in a gate driver in panel (GIP) type. Alternatively, the gate driver 200 can be manufactured as a driving chip, mounted on the flexible film 330, and provided in the non-active area outside the one side or both sides of the active area AA of the substrate 100 in a tape automated bonding (TAB) type.

The source driver IC 310 can receive digital image data and a source control signal from the timing controller 400. The source drive IC 310 can convert the digital video data into analog data voltages according to the source control signal and supply the analog data voltages to the data lines. When the source drive IC 310 is manufactured as a driving chip, the source drive IC 310 can be mounted on the flexible film 330 in a chip on film (COF) type or a chip on plastic (COP) type.

A plurality of lines for connecting the pads to the source drive IC 310 and a plurality of lines for connecting the pads to lines of the circuit board 350 can be provided on the flexible film 330. The flexible film 330 can be attached on the pads by using an anisotropic conductive film, and thus, the pads can be connected to the lines of the circuit board 330.

The circuit board 350 can be attached on the flexible film 330 which is provided in plurality. A plurality of circuits implemented as driving chips can be mounted on the circuit board 350. For example, the timing controller 400 can be mounted on the circuit board 350. The circuit board 350 can be a printed circuit hoard (PCB) or a flexible PCB (FPCB).

The timing controller 400 can receive digital video data and a timing signal from an external system through a cable of the circuit board 350. The timing controller 400 can generate the gate control signal for controlling an operation timing of the gate driver 200 and the source control signal for controlling the source drive IC 310 which is provided in plurality, based on the timing signal. The timing controller 400 can supply the gate control signal to the gate driver 200 and supply the source control signal to the source drive ICs 310.

Figure 2:
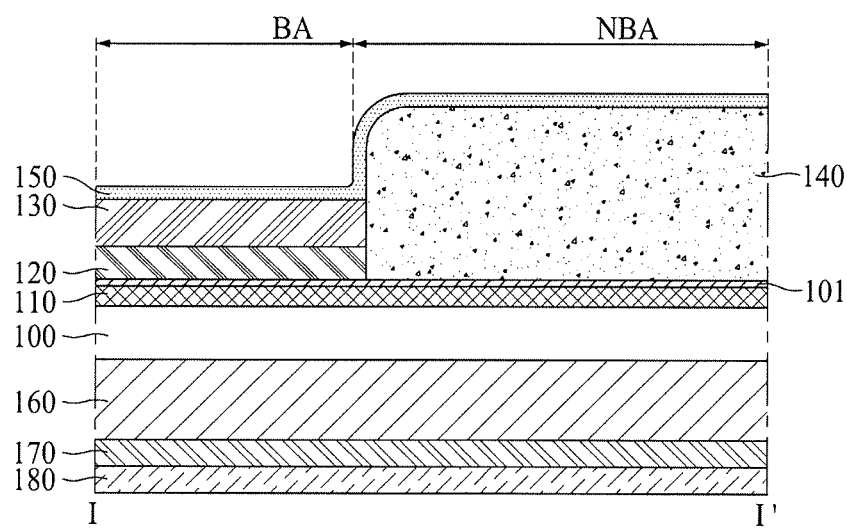
FIG. 2 is a cross-sectional view, taken along line I-I' of FIG. 1, of an organic light emitting display apparatus according to an embodiment of the present disclosure.
Figure 3:
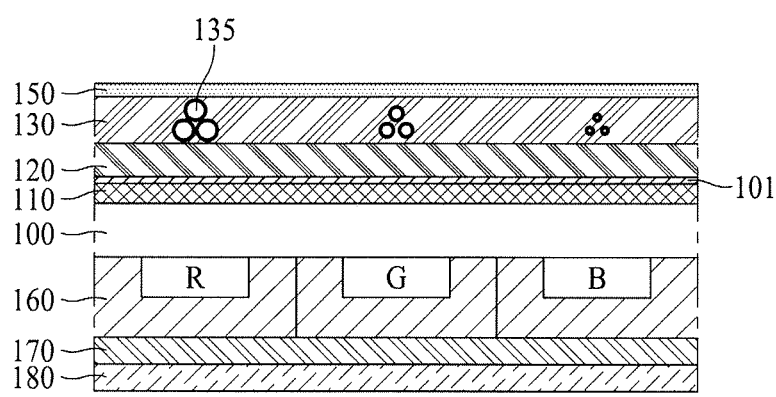
FIG. 3 is a diagram illustrating a portion of a stacked structure of a plurality of pixels provided in a bending area according to an embodiment of the present disclosure.

FIG. 2 is a cross-sectional view, taken along line I-I' of FIG. 1, of an organic light emitting display apparatus according to an embodiment of the present disclosure, and FIG. 3 is a diagram illustrating a portion of a stacked structure of a plurality of pixels provided in a bending area.

Referring to FIGS. 2 and 3, the organic light emitting display apparatus according to the present embodiment can include a substrate 100, a light conversion film 130, a light reflection layer 120, an optical film 140, a protective film 150, a pixel array layer 150, and an encapsulation member 180.

The substrate 100 can be a thin film transistor (TFT) array substrate and can be formed of a glass or plastic material. The substrate 100 according to an embodiment can include an active area AA and a non-active area NA.

The light conversion film 130 can be disposed in a bending area BA of the substrate 100. The light conversion film 130 according to an embodiment can be formed of a film or a sheet. The light conversion film 130, which includes a transparent film, may use generally used films without limitation, and for example, can use a film which is good in transparency, mechanical strength, and thermal stability.

The light conversion film 130 according to an embodiment can include light conversion particles 135.

The light conversion particles 135 can be inserted into and provided in the light conversion film 130. The light conversion particles 135 can have a characteristic where the light conversion particles 135 absorb light having a short wavelength to emit light, and can convert light into light having a specific wavelength, thereby enhancing color reproducibility (e.g., changes a high energy light, such as UV light or blue light, into a lower energy light, such as blue, light blue, green, yellow, orange, red etc.). The light conversion particles 135 can absorb light, and thus, can perform a light reflecting function of an optical film.

The light conversion particles 135 according to an embodiment can each be a quantum dot.

The quantum dot can be a nano-sized semiconductor material. An atom can constitute a molecule, and a molecule can constitute a set of small molecules called a cluster, thereby constituting a nano-sized particle. When a nano-sized particle has a semiconductor characteristic, the nano-sized particle can be referred to as a quantum dot. When the quantum dot is supplied with energy from the outside to reach an excited state, the quantum dot can autonomously emit energy based on a corresponding energy bandgap.

A quantum dot according to an embodiment is not limited and can use all types of quantum dots capable of emitting light based on stimulation by light. For example, the quantum dot can be selected from the group consisting of a Group II-VI semiconductor compound, a Group V semiconductor compound, a Group IV-VI semiconductor compound, a Group IV semiconductor compound, a compound including the same, and a combination thereof. Each of the compounds can be used individually, or two or more of the compounds can be mixed and used.

The Group II-VI semiconductor compound can be selected from the group comprising a two-element compound selected from the group comprising CdS, CdSe, CdTe, ZnS, ZnSe, ZnTe, ZnO, HgS, HgSe, HgTe, and a compound thereof, the group comprising a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a compound thereof, and the group comprising a four-element compound selected from the group comprising CdZnSeS, CdZnSeTe, CdZnSTe, CdHgSeS, CdHgSeTe, CdHgSTe, HgZnSeS, HgZnSeTe, HgZnSTe, and a compound thereof. The Group III-V semiconductor compound can be selected from the group comprising a two-element compound selected from the group consisting of GaN, GaP, GaAs, GaSb, AlN, AlP, AlAs, AlSb, InN, InP, InAs, InSb, and a compound thereof, a three-element compound selected from the group comprising GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a compound thereof, and a four-element compound selected from the group comprising GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and a compound thereof. The Group IV-VI semiconductor compound can be selected from the group comprising a two-element compound selected from the group consisting of SnS, SnSe, SnTe, PbS, PbSe, PbTe, and a compound thereof, a three-element compound selected from the group comprising SnSeS, SnSeTe, SnSTe, PbSeS, PbSeTe, PbSTe, SnPbS, SnPbSe, SnPbTe, and a compound thereof, and a four-element compound selected from the group comprising SnPbSSe, SnPbSeTe, SnPbSTe, and a compound thereof. The Group IV semiconductor compound or a compound including the same can be selected from the group comprising an element compound selected from the group comprising Si, Ge, and a compound thereof and a two-element compound selected from the group comprising SiC, SiGe, and a compound thereof. However, the present embodiment is not limited thereto.

The light conversion particles 135 according to an embodiment can be a red quantum dot, a green quantum dot, and a blue quantum dot, which have different sizes. As when a colored photosensitive resin composition generally used to manufacture a color filter includes a red pigment, a green pigment, and a blue pigment for color reproduction, the light conversion particles 135 according to embodiments of the present disclosure can be classified into a quantum dot representing red, a quantum dot representing green, and a quantum dot representing blue.

The light conversion particles 135 according to an embodiment can be produced by irradiating an ultraviolet (VU) laser onto a compound selected from the group consisting of a Group II-VI semiconductor compound, a Group III-V semiconductor compound, a Group IV-VI semiconductor compound, a Group IV semiconductor compound, a compound including the same, and a combination thereof. In this instance, by controlling an irradiation time and an irradiation amount of the UV laser, a size of each of the light conversion particles 135 can be adjusted, and thus, quantum dots having different sizes and/or different shapes can be produced.

The light reflection layer 120 can be provided between the substrate 100 and the light conversion film 130. The light reflection layer 120 according to an embodiment can be formed as a UV reflection layer for protecting the substrate 100, a transistor, and an organic light emitting layer that can be provided in the bending area BA of the substrate 100. Since the light reflection layer 120 is provided between the substrate 100 and the light conversion film 130, the substrate 100, the transistor, and the organic light emitting layer are prevented from being corroded or damaged by the UV laser in a process of irradiating the UV laser onto the light conversion film 130 to produce a quantum dot.

For example, metal materials included in the transistor and the organic light emitting layer absorb UV light, and for this reason, are corroded when exposed to UV light. Therefore, the organic light emitting display apparatus according to embodiments of the present disclosure can include the light reflection layer 120, for preventing other materials from being corroded or damaged in a process of irradiating the UV laser for producing a quantum dot.

The light reflection layer 120 can be attached on the substrate 100 by a first adhesive layer 110. The first adhesive layer 110 can be a thermoscurable adhesive, a naturally curable adhesive, or the like. For example, the first adhesive layer 110 can be formed of a pressure sensitive adhesive material or a barrier pressure sensitive adhesive material having a moisture absorbing function.

The optical film 140 can be disposed in the non-bending area NBA of the substrate 100. The optical film 140 according to an embodiment can include a polarizing film or a low reflection film, such as an anti-reflection film or an anti-glare film, and can be formed of a multilayer including the films. The optical film 140 prevents penetration of water, enhances visibility by reflecting external light, and increases a color reproducibility of light emitted from the light emitting device layer.

The protective film 150 can be provided in both the bending area BA and the active area AA of the substrate 100 to cover the light conversion film 130 and the optical film 140. The protective film 150 according to an embodiment can protect the light conversion film 130 having a very thin thickness, can be a transparent film, and be a film that has good mechanical strength, thermal stability, water blocking performance, and isotropy. For example, the protective film 150 can use an acetate-based resin film such as triacetyl cellulose (TAC), a polyether-based resin film, a polyethersulfone-based resin film, a polycarbonate-based resin film, a polyamide-based resin film, a polyimide-based resin film, a polyolefin-based resin film, a cycloolefin-based on resin film, a polyurethane-based rein film, and an acryl-based resin film, but is not limited thereto.

The protective film 150 according to an embodiment can be provided to protect the light conversion film 130 and the optical film 140 from external foreign materials, and a thickness of the protective film 150 can be approximately 1 μm to 500 μm, and for example, can be approximately 1 μm to 300 μm. A functional coating layer can be provided on at least one surface of the protective film 150.

The functional coating layer can be an external light reflection reducing layer or a brightness enhancement layer, but is not limited thereto. In the organic light emitting display apparatus, the functional coating layer can be used as an optical function layer.

The protective film 150 can be provided to cover the light conversion film 130 and the optical film 140, and thus, can protect a boundary portion between the light conversion film 130 and the optical film 140. Since there is a difference between a thickness of the light conversion film 130 and a thickness of the optical film 140, a step height occurs in the boundary portion (e.g., the optical film 140 is thicker than the light conversion film), and due to this, the light conversion film 130 and the optical film 140 are damaged by an external impact and are separated from each other. However, the protective film 150 can be provided in and across the entire active area AA to cover the boundary portion between the light conversion film 130 and the optical film 140, and thus, the light conversion film 130 and the optical film 140 are prevented from being separated from each other by an external damage.

The pixel array layer 160 can be disposed in the active area AA of the substrate 100. The pixel array layer 160 according to an embodiment can be provided on a first surface of the substrate 100 overlapping the active area AA defined on the substrate 100. The first surface can be a surface opposite to a second surface, on which the light conversion film 130 and the optical film 140 are provided, of the substrate 100.

The pixel array layer 160 can include a plurality of scan lines, a plurality of data lines, a plurality of driving power lines, a pixel driving circuit, a color filter, and a light emitting device layer.

The scan lines can be arranged in parallel with a first lengthwise direction X of the substrate 100 and spaced apart from one another along a second lengthwise direction Y of the substrate 100.

The data lines can be arranged in parallel with the second lengthwise direction Y of the substrate 100 and spaced apart from one another along the first lengthwise direction X of the substrate 100.

The driving power lines can be arranged in parallel with the data lines.

The pixel driving circuit can be provided in each of a plurality of pixel areas defined by intersections of the scan lines and the data lines and can include at least two TFTs and at least one capacitor. The pixel driving circuit can allow the light emitting device layer to emit light according to a scan signal supplied through an adjacent scan line, a driving power supplied through an adjacent driving power line, and a data signal supplied through an adjacent data line.

The color filter can be provided in each of a plurality of pixels overlapping an opening area. The light emitting layer according to an embodiment can include a white organic light emitting device, and thus, the color filter may transmit only light, having a wavelength of a color corresponding to a corresponding pixel, of white light. The color filter can include a red color filter, a green color filter, and a blue color filter corresponding to a color defined in each of the plurality of pixels.

The light emitting device layer may emit light, based on a data signal supplied from the pixel driving circuit of a corresponding pixel. The light emitted from the light emitting device layer can pass through the substrate 100 and be extracted to the outside. The light emitting device layer can include a first electrode connected to the pixel driving circuit of a corresponding pixel, a light emitting layer provided on the first electrode, and a second electrode provided on the light emitting layer.

The first electrode can be an anode electrode which is individually patterned in each of a plurality of pixels. The first electrode can be formed of a transparent metal material such as indium tin oxide (ITO) or indium zinc oxide (IZO) capable of transmitting light.

The light emitting layer according to an embodiment can be a common layer which is provided in common in the plurality of pixels P, and in this instance, a manufacturing process is simplified. The light emitting layer can include one of an organic light emitting layer, an inorganic light emitting layer, and a quantum dot light emitting layer, or can include a stacked or mixed structure of an organic light emitting layer or an inorganic light emitting layer and a quantum dot light emitting layer. The light emitting layer can include two or more light emitting parts for emitting white light. For example, the light emitting layer can include a first light emitting part and a second light emitting part for emitting the white light based on a combination of first light and second light. Here, the first light emitting part can emit the first light and can include one of a blue light emitting part, a green light emitting part, a red light emitting part, a yellow light emitting part, and a yellow-green light emitting part. The second light emitting part can include a light emitting part emitting light having a complementary color relationship of the first light among a blue light emitting part, a green light emitting part, a red light emitting part, a yellow light emitting part, and a yellow-green emitting part.

The second electrode, for example, a cathode electrode, can be a common layer which is provided in common in the plurality of pixels. The second electrode can include a metal material, which is high in reflectivity. For example, the second electrode may be formed in a multilayer structure such as a stacked structure (Ti/Al/Ti) of Al and Ti, a stacked structure (ITO/Al/ITO) of Al and ITO, an APC (Ag/Pd/Cu) alloy, or a stacked structure (ITO/APC/ITO) of an APC alloy and ITO, or can include a single-layer structure including one material or two or more alloy materials selected from among Ag, Al, Mo, Au, Mg, calcium (Ca), and barium (Ba).

The encapsulation member 180 can be provided on the light emitting layer, for preventing penetration of water to protect the light emitting layer vulnerable to external water or oxygen. That is, the encapsulation member 180 can be provided on the substrate 100 to cover the second electrode. The encapsulation member 180 according to an embodiment can be formed of an inorganic layer or an organic layer, or can be formed in a multilayer structure where an inorganic layer and an organic layer are alternately stacked.

The encapsulation member 180 can be attached on the pixel array layer 160 by a second adhesive layer 170. The second adhesive layer 170 can be a thermoscurable adhesive, a naturally curable adhesive, or the like. For example, the second adhesive layer 170 can be formed of a material such as a pressure sensitive adhesive or a barrier pressure sensitive adhesive having a moisture absorbing function.

Referring again to FIG. 2, a composite film can be provided on the substrate 100.

The composite film may include the light reflection layer 120, the light conversion film 130, the optical film 140, and the protective film 150. Hereinafter, overlapping descriptions of the same elements are omitted, and an additional feature will be described.

The light reflection layer 120 can be provided in a first area of a base substrate 101. Here, the base substrate 101 can be a base film, and the base substrate 101 can include the first area and a second area. Alternatively, according to an embodiment, the base substrate 101 can be omitted and the light reflection layer 120 and the optical film 140 can both directly contact the first adhesive layer 110.

The light conversion film 130 can be provided on the light reflection layer 120.

The optical film 140 can be provided on the second area of the base substrate 101.

The composite film according to an embodiment can be formed of different materials in the first area and the second area of the base substrate 101, and a side surface of the light reflection layer 120 and a side surface of the light conversion film 130 provided in the first area of the base substrate 101 can both contact a side surface of the optical film 140 provided in the second area of the base substrate 101. The optical film 140 can be formed thicker than a thickness of each of the light reflection layer 120 and the light conversion film 130, and/or thicker than a sum of thicknesses of the light reflection layer 120 and the light conversion film 130. The optical film 140 can be formed of a stacked film for a polarization function and can have a thick thickness due to a stacked structure. Accordingly, the optical film 140 can be formed thicker than the sum of thicknesses of the light reflection layer 120 and the light conversion film 130, and a step height can be formed in a boundary portion between the light conversion film 130 and the optical film 140.

The protective film 150 can be provided to cover the light conversion film 130 and the optical film 140. The step height can be formed in the boundary portion between the light conversion film 130 and the optical film 140, and thus, the protective film 150 can be provided to cover the boundary portion between the light conversion film 130 and the optical film 140.

The composite film according to embodiments of the present disclosure can be attached on the substrate 100 by the first adhesive layer 110. An organic light emitting display apparatus with the composite film attached thereon can have a structure having the cross-sectional view of FIG. 2, and the feature and effect of the organic light emitting display apparatus are the same as the above-described feature and effect.

Referring again to FIG. 3, the light conversion particles 135 according to embodiments of the present disclosure can be provided in an area overlapping the color filter provided on the pixel array layer 160. The color filter may be provided in each of a plurality of pixels overlapping an opening area and can include a red color filter, a green color filter, and a blue color filter corresponding to a color defined in each of the plurality of pixels. Thus, the light conversion particles 135 can include a red quantum dot, a green quantum dot, and a blue quantum dot corresponding to a color defined in each of the plurality of pixels.

The red quantum dot, the green quantum dot, and the blue quantum dot can have different sizes. In this instance, the red quantum dot can be greater in size than the green quantum dot, and the green quantum dot can be greater in size than the blue quantum dot. The red quantum dot, the green quantum dot, and the blue quantum dot according to an embodiment can absorb respective lights which have a red wavelength, a green wavelength, and a blue wavelength by passing through the red color filter, the green color filter, and the blue color filter, and may reduce a width of a wavelength to emit light, thereby implementing an organic light emitting display apparatus having high color reproducibility.

Figure 4A:
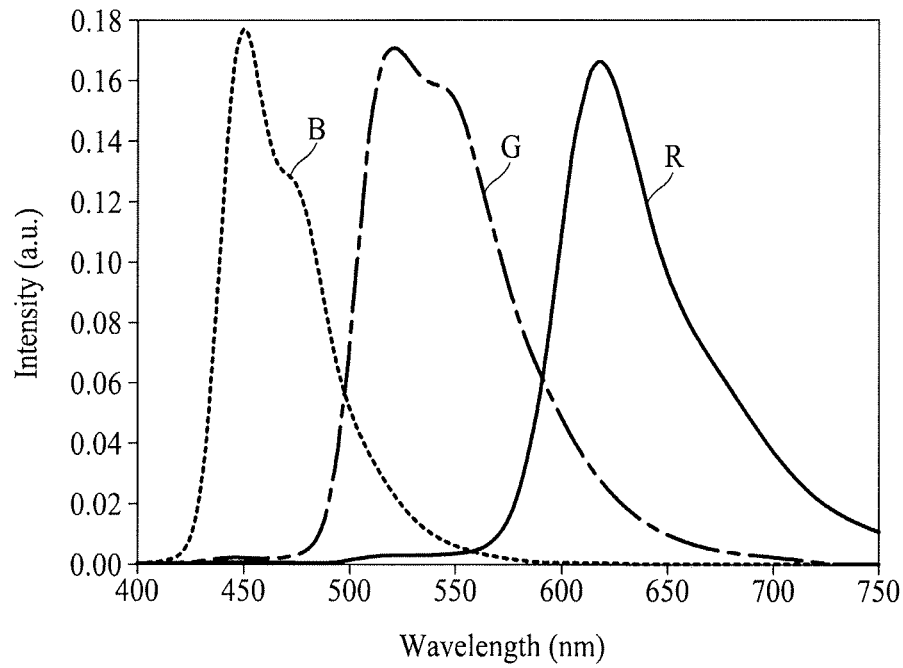
FIG. 4A is a diagram showing an intensity of light output from a bending area of an organic light emitting display apparatus according to an embodiment of the present disclosure.
Figure 4B:
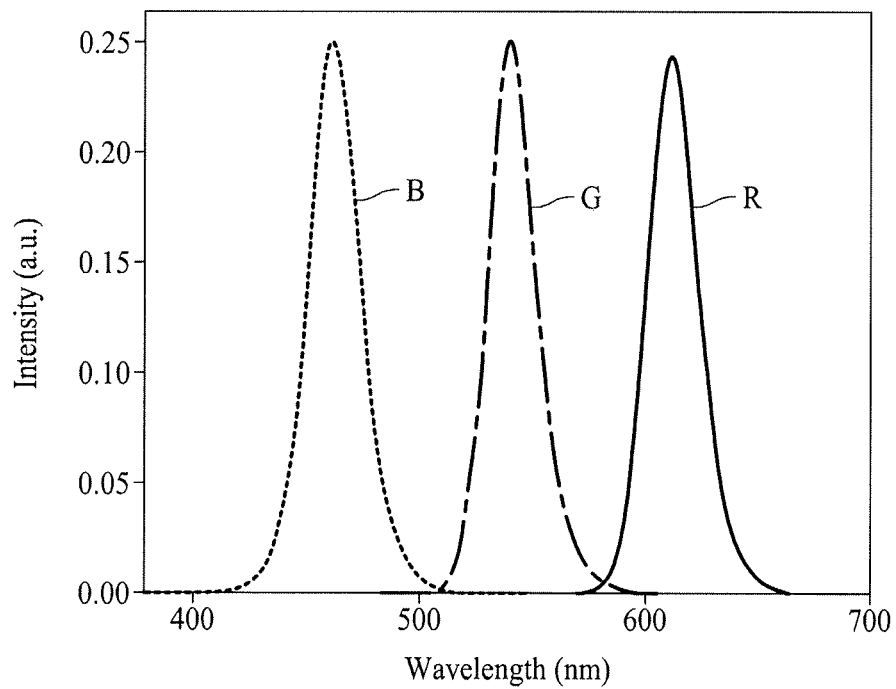
FIG. 4B is a diagram showing an intensity of light output from a related art organic light emitting display apparatus.

FIG. 4A is a diagram showing an intensity of light output from a bending area of an organic light emitting display apparatus according to an embodiment of the present disclosure, and FIG. 4B is a diagram showing an intensity of light output from a related art organic light emitting display apparatus.

To describe a result obtained by comparing FIGS. 4A and 4B, in comparison with the related art organic light emitting display apparatus, it can be seen that in the organic light emitting display apparatus according to an embodiment of the present disclosure, a range of a wavelength band where light is output is narrow, and intensity is high. In comparison with the related art organic light emitting display apparatus, the organic light emitting display apparatus according to an embodiment of the present disclosure may emit light which is relatively high in intensity and is wholly uniform.

In the organic light emitting display apparatus according to an embodiment of the present disclosure, since the optical film 140 is not provided in the bending area BA and the light conversion film 130 including the light conversion particles 135 is provided, intensity increases to realize high color reproducibility, thereby realizing a high efficiency characteristic based on a narrow full width at half maximum (FWHM) to enhance an optical characteristic.

Likewise, in the organic light emitting display apparatus according to an embodiment of the present disclosure, the light conversion particles 135 in the bending area BA can be formed as quantum dots having various sizes, and thus, a fine color variation of the organic light emitting display apparatus may be performed by controlling the quantum dots. That is, since the quantum dots are formed as a red quantum dot, a green quantum dot, and a blue quantum dot, the color reproducibility of lights having a red wavelength, a green wavelength, and a blue wavelength may be optionally selected. Also, the light conversion particles 135 can be formed as quantum dots which absorb/emit a color which enables a complementary color or fine color variation of the quantum dots, thereby enabling a fine color variation. For example, a group of quantum dots for a given color can widen that specific color's wavelength band to the right (e.g., expand it to include more light of lower wavelengths). For example, if the pixel array has a blue color filter that outputs blue light toward the light conversion film, the light conversion film can use "blue sized" quantum dots to add a light blue color to be combined with the blue color coming out of the pixel array. The other sized quantum dots can behave similarly (e.g., "red sized" quantum dots can add a darker red color to be combined with the red color coming out of the pixel array).

A width of a wavelength and an intensity value shown in FIG. 4A are not limited thereto, and a narrower width of a wavelength and a high intensity value are realized by adjusting sizes and/or amounts of the light conversion particles 135.

Figure 5A:
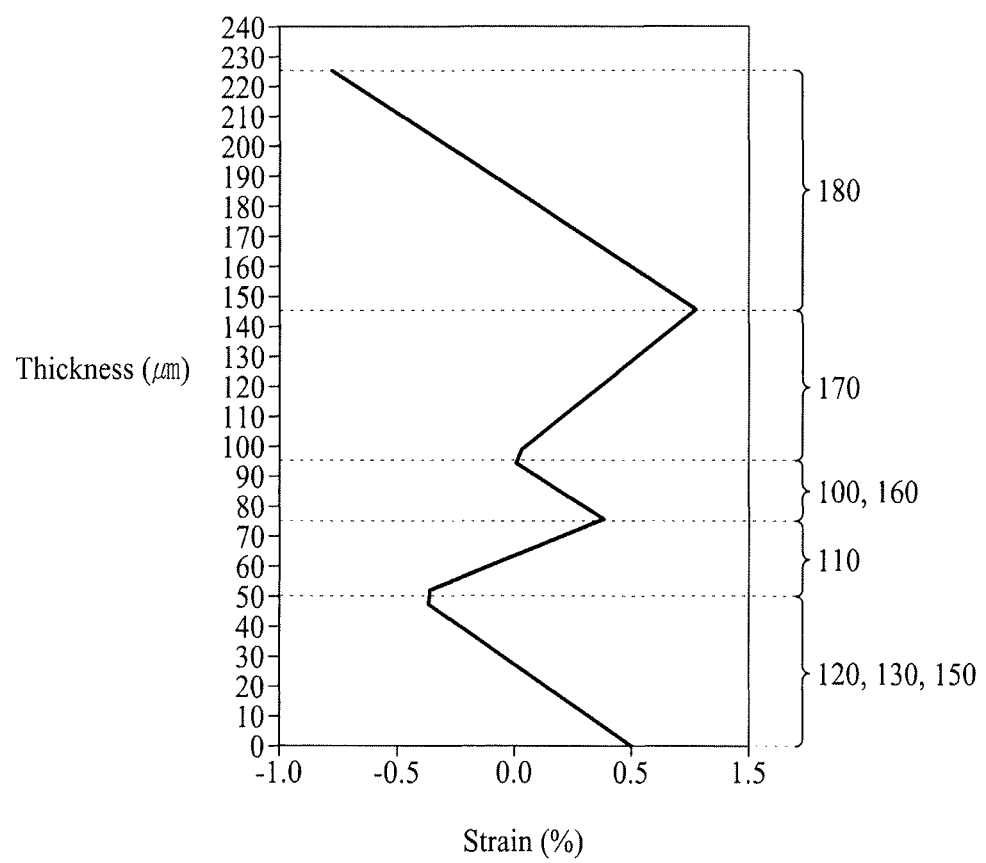
FIG. 5A is a graph showing a strain distribution variation when bending an organic light emitting display apparatus according to an embodiment of the present disclosure.
Figure 5B:
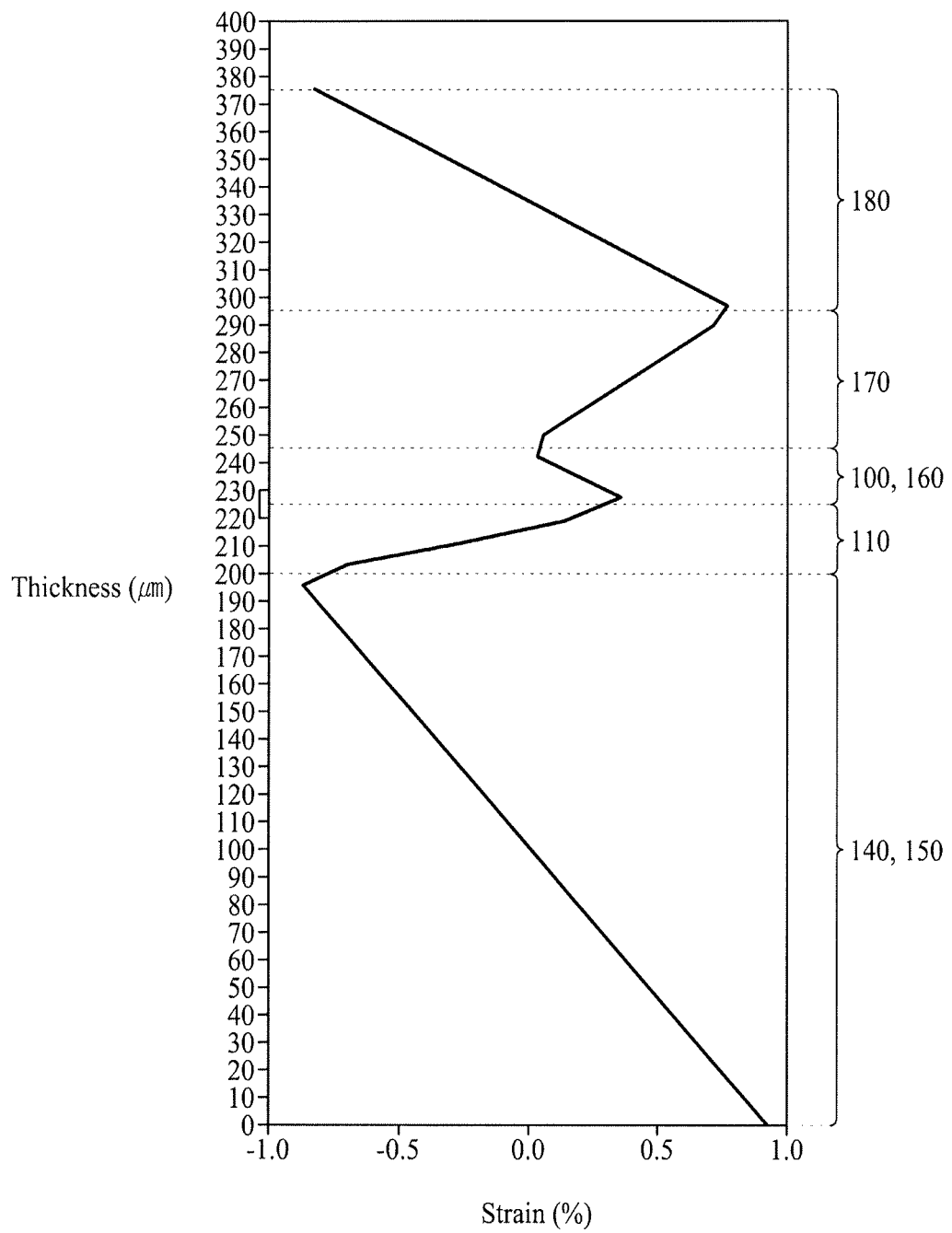
FIG. 5B is a graph showing a strain distribution variation when bending a related art organic light emitting display apparatus.

FIG. 5A is a graph showing a strain distribution variation when bending an organic light emitting display apparatus according to an embodiment of the present disclosure, and FIG. 5B is a graph showing a strain distribution variation when bending a related art organic light emitting display apparatus.

To describe a result obtained by comparing FIGS. 5A and 5B, in comparison with the related art organic light emitting display apparatus, it can be seen that the organic light emitting display apparatus according to an embodiment of the present disclosure has a thin thickness in the bending area BA. That is, if the optical film 140 provided in the non-bending area NBA is disposed as-is in the bending area BA, a degree of bending increases due to a thick thickness, and thus, an outermost strain increases and an internal strain of a panel is made very large. For this reason, the light emitting device layer gets peeled off, and the TFT is short-circuited. In order to solve such problems, the light conversion film 130 which has a thin thickness and high color reproducibility in comparison with the optical film 140 can be provided in the bending area BA.

A thickness of a stacked structure of the light conversion film 130, the light reflection layer 120, and the protective film 150 according to an embodiment may have approximately 50 μm, and a thickness of a stacked structure of the optical film 140 and the protective film 150 may have approximately 200 μm. For example, a ratio of a stacked structure of the light conversion film 130, the light reflection layer 120, and the protective film 150, to a thickness of a stacked structure of the optical film 140 and the protective film 150 can be about 1:4. Accordingly, the bending area BA can have a relatively thin thickness (e.g., about $\frac{1}{4}^{th}$ as thick as the corresponding portion of the non-bending area NBA), and bending can be easily performed. However, a thickness of a stacked structure of the organic light emitting display apparatus according to an embodiment is not limited thereto.

Referring again to FIGS. 5A and 5B, it can be seen that in a structure where the optical conversion film 130 is provided, a strain value is considerably reduced. Since a strain value applied to the bending area BA is considerably reduced, a problem where a crack occurs in bending is solved, and edge bending is easily performed.

As described above, in the organic light emitting display apparatus according to an embodiment of the present disclosure, since a convention optical film 140 is not disposed in the bending area BA, a problem where a crack occurs in bending is solved, and the light conversion film 130 can perform a function of the conventional optical film 140, thereby more improving color reproducibility. The light conversion particles 135 included in the light conversion film 130 can absorb external light as well as light traveling from the inside of the organic light emitting display apparatus to the outside, and thus, the light conversion particles 135 can perform a light reflecting function of the conventional optical film 140 by absorbing the external light and converting it into light having a specific wavelength, thereby enhancing color reproducibility.

As described above, the organic light emitting display apparatus according to embodiments of the present disclosure is easy to bend in the bending area and has good optical characteristics, such as high color reproducibility, thereby enhancing image quality, a sense of three dimensions and a sense of immersion.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus comprising:
a substrate including an active area and a non-active area;
a pixel array layer disposed on a first surface of the substrate, the pixel array layer overlapping with the active area;
a bending area in the active area of the substrate;
a non-bending area in the active area of the substrate, the non-bending area being adjacent to the bending area;
an optical film disposed on the second surface of the substrate overlapping the non-bending area; and
a light conversion film comprising a plurality of light conversion particles disposed in the bending area in the active area of the substrate,
wherein the optical film is disposed adjacent to the light conversion film and contacts an edge of the light conversion film without extending into the bending area, and
wherein the light conversion film includes a plurality of quantum dots in the bending area and the non-bending area is devoid of quantum dots.

2. The organic light emitting display apparatus of claim 1, wherein the plurality of light conversion particles are quantum dots.

3. The organic light emitting display apparatus of claim 1, further comprising:
a light conversion film disposed in the bending area of the substrate,
wherein the plurality of light conversion particles are included in the light conversion film.

4. The organic light emitting display apparatus of claim 3, further comprising:

a light reflection layer disposed between the substrate and the light conversion film.

5. The organic light emitting display apparatus of claim 4, wherein the light reflection layer is an ultraviolet reflection layer configured to reflect ultraviolet light.

6. The organic light emitting display apparatus of claim 1, further comprising an encapsulation member covering the pixel array layer,
wherein the plurality of light conversion particles are disposed on a second surface opposite to the first surface of the substrate, and the substrate is disposed between the pixel array layer and the plurality of light conversion particles.

7. The organic light emitting display apparatus of claim 1, further comprising:
a light conversion film disposed in the bending area of the substrate, wherein the plurality of light conversion particles are included in the light conversion film; and
a protective film disposed on the optical film and the light conversion film,
wherein the protective film covers a boundary portion between the light conversion film and the optical film.

8. The organic light emitting display apparatus of claim 1, further comprising:
a plurality of pixels disposed in the bending area,
wherein the plurality of light conversion particles have different sizes based on a color set in each of the plurality of pixels in the bending area.

9. The organic light emitting display apparatus of claim 8, wherein the plurality of light conversion particles include a red quantum dot, a green quantum dot, and a blue quantum dot.

10. A composite film comprising:
a base substrate;
a light reflection layer disposed in a first area of the base substrate;
a light conversion film disposed on the light reflection layer;
an optical film disposed in a second area of the base substrate, the second area being adjacent to the first area of the base substrate; and
a protective film covering the light conversion film and the optical film,
wherein the light conversion film contacts the optical film,
wherein a boundary portion between the light conversion film and the optical film has a step height,
wherein the optical film is disposed adjacent to the light conversion film and contacts an edge of the light conversion film without extending into the first area, and
wherein the light conversion film includes a plurality of quantum dots in the first area and the second area is devoid of quantum dots.

11. The composite film of claim 10, wherein the light conversion film includes a plurality of light conversion particles.

12. The composite film of claim 10, wherein a sum of a thickness of the light reflection layer and a thickness of the light conversion film is less than a thickness of the optical film.

13. The composite film of claim 10, wherein the protective film covers the boundary portion between the light conversion film and the optical film.

14. An organic light emitting display apparatus comprising the composite film of claim 10 and a substrate,
wherein the composite film is disposed on the substrate.

15. An organic light emitting display apparatus comprising:
a pixel array layer including a plurality of pixels disposed across a bending area of the pixel array layer and a non-bending area of the pixel array layer;
an optical film disposed in the non-bending area;
a light conversion film disposed in the bending area;
a protective film disposed across a boundary between the non-bending area and the bending area,
wherein the optical film is disposed adjacent to the light conversion film and contacts an edge of the light conversion film without extending into the bending area,
wherein the light conversion film includes a plurality of quantum dots in the bending area and the non-bending area is devoid of quantum dots,
wherein the optical film in the non-bending area is thicker than the light conversion film in the bending area, and
wherein the plurality of quantum dots are arranged in a plurality of groups.

16. The organic light emitting display apparatus of claim 15, wherein each of the plurality of groups overlaps with one of the plurality of pixels located in the bending area and is configured to convert light output by the one of the plurality of pixels into converted light having a wavelength that corresponds to a same color of the light output by the one of the plurality of pixels, and
wherein the wavelength of the converted light is longer than a wavelength of the light output by the one of the plurality of pixels.

17. The organic light emitting display apparatus of claim 15, further comprising: a light reflection layer disposed between the light conversion film and the pixel array layer,
wherein a sum of a thickness of the light reflection layer and a thickness of the light conversion film is less than a thickness of the optical film.

18. The organic light emitting display apparatus of claim 17, wherein the optical film includes a plurality of film layers,
wherein first portions of the protective film and the optical film form a first stacked structure in the non-bending area,
wherein second portions of the protective film, the light reflection layer and the light conversion film form a second stacked structure in the bending area, and
wherein a ratio of a thickness of the second stacked structure to a thickness of the first stacked structure is approximately 1:4.

* * * * *